(12) United States Patent
Yeung et al.

(10) Patent No.: US 7,944,290 B2
(45) Date of Patent: May 17, 2011

(54) TRANS-IMPEDANCE AMPLIFIER

(75) Inventors: Pak-Ho Yeung, Cupertino, CA (US);
Daisuke Umeda, Osaka (JP)

(73) Assignee: Sumitomo Electric Industries, Ltd.,
Osaka (JP)

(*) Notice: Subject to any disclaimer, the term of this patent is extended or adjusted under 35 U.S.C. 154(b) by 58 days.

(21) Appl. No.: 12/360,094

(22) Filed: Jan. 26, 2009

(65) Prior Publication Data

US 2010/0188154 A1 Jul. 29, 2010

(51) Int. Cl.
*H03F 1/14* (2006.01)

(52) U.S. Cl. .......................... 330/51; 330/295; 330/307

(58) Field of Classification Search .................... 330/51, 330/331, 277, 307–308, 295, 124 R
See application file for complete search history.

(56) References Cited

U.S. PATENT DOCUMENTS

| | | | |
|---|---|---|---|
| 4,282,515 A | 8/1981 | Patterson, III | |
| 4,978,872 A | 12/1990 | Morse et al. | |
| 5,606,277 A | 2/1997 | Feliz | |
| 5,606,282 A | 2/1997 | Yoshida | |
| 6,114,913 A * | 9/2000 | Entrikin | 330/308 |
| 6,121,843 A | 9/2000 | Vampola et al. | |
| 6,339,363 B1 | 1/2002 | Fowler | |
| 6,459,078 B1 | 10/2002 | Fowler | |
| 6,472,936 B1 * | 10/2002 | Jones | 330/51 |
| 6,504,429 B2 | 1/2003 | Kobayashi | |
| 6,690,506 B2 | 2/2004 | Zahnley et al. | |
| 6,737,924 B1 | 5/2004 | Paillet et al. | |
| 7,358,816 B2 * | 4/2008 | Ryu et al. | 330/285 |
| 2003/0090326 A1 | 5/2003 | Pogrebinsky et al. | |

FOREIGN PATENT DOCUMENTS

| | | |
|---|---|---|
| JP | 11-088067 A | 3/1999 |
| JP | 2002-344266 A | 11/2002 |
| JP | 2006-345546 A | 12/2006 |
| WO | WO 2006/095416 A1 | 9/2006 |

OTHER PUBLICATIONS

International Search Report for Application No. PCT/JP2009/058691, dated Aug. 4, 2009, 2 pages.
"DS14C232 Low Power +5V Powered TIA/EIA-232 Dual Driver/Receiver", National Semiconductor Corporation, 1999, 12 pages.
Gui, P., "Design and System Integration of Power-Efficient Gigabit Parallel Optical Links for Computer Communication", 2004, 132 pages. Ikeda, H., et al., "An Auto-Gain Control Transimpedance Amplifier with Low Noise and Wide Input Dynamic Range for 10-Gb/s Optical Communication Systems", IEEE Journal of Solid-State Circuits, vol. 36, No. 9, Sep. 2001, 6 pages.
"Maxim +3.3V, 2.5Gbps Quad Transimipedance Amplifier for System Interconnects", Maxim Integrated Products, Sunnyvale, CA, 2000, 8 pages.
Sackinger, E., "Broadband Circuits for Optical Fiber Communication", 2005, New Jersey and Canada, 58 pages.
Wanum, M., et al., "Dual Transimpedance Amplifier for 43 Gbps applications", TNO Physics and Electronics Library, 4 pages, 2002.

* cited by examiner

*Primary Examiner* — Hieu P Nguyen
(74) *Attorney, Agent, or Firm* — Fish & Richardson P.C.

(57) ABSTRACT

Systems and apparatus for converting an input current signal into two or more output voltage signals on an integrated circuit. In one aspect, an integrated circuit includes a first trans-impedance amplifier that includes a first cascode amplifier; and a second trans-impedance amplifier that includes a second cascode amplifier, the second cascode amplifier and the first cascode amplifier sharing an input transistive element; where the first cascode amplifier is coupled to one or more first switches that disable the first trans-impedance amplifier, the second cascode amplifier is coupled to one or more second switches that disable the second trans-impedance amplifier, and control logic coupled to the one or more first switches and the one or more second switches disables at least one of the first trans-impedance amplifier or the second trans-impedance amplifier.

19 Claims, 4 Drawing Sheets

TRANS-IMPEDANCE AMPLIFIER

BACKGROUND

The present specification relates generally to trans-impedance amplifiers.

Trans-impedance amplifiers can be used to convert (or transform) an input current signal into an output voltage signal. A trans-impedance amplifier can be an active circuit with a transfer gain, or trans-impedance, of $k=V_{out}/I_{in}$ (volts/amperes), where $I_{in}$ is a magnitude of the input current signal and $V_{out}$ is a magnitude of the output voltage signal. Ideally, a trans-impedance amplifier has a low input impedance (e.g., an input impedance equal to zero).

In practice, some applications of a trans-impedance amplifier can require that the trans-impedance amplifier be able to operate at multiple rates (e.g., 1 Gb/sec or 10 Gb/sec). A conventional multi-rate trans-impedance amplifier can switch between conversion at multiple rates by changing one or more impedances within the trans-impedance amplifier. Typically, switches in a signal path (e.g., switches in series with resistive elements in the trans-impedance amplifier) of the trans-impedance amplifier are used to change the impedances and switch between the multiple rates.

As an example, a conventional multi-rate trans-impedance amplifier can include a feedback subcircuit that includes a transistor in series with a first resistor. The series combination of the transistor and first resistor can be coupled in parallel to a second resistor. In the conventional multi-rate trans-impedance amplifier, switching from conversion at a first rate to a second rate can include enabling or disabling the transistor to change an equivalent impedance of the feedback subcircuit.

SUMMARY

In general, one aspect of the subject matter described in this specification can be embodied in an integrated circuit. The integrated circuit includes a first trans-impedance amplifier that includes a first cascode amplifier; and a second trans-impedance amplifier that includes a second cascode amplifier. The second cascode amplifier and the first cascode amplifier share an input transistive element. The first cascode amplifier is coupled to one or more first switches that disable the first trans-impedance amplifier. The second cascode amplifier is coupled to one or more second switches that disable the second trans-impedance amplifier. Control logic coupled to the one or more first switches and the one or more second switches disables at least one of the first trans-impedance amplifier or the second trans-impedance amplifier. Other embodiments of this aspect include corresponding systems.

These and other embodiments can optionally include one or more of the following features. The first cascode amplifier includes a first resistive element with a first impedance, and the second cascode amplifier includes a second resistive element with a second impedance; the second impedance being distinct from the first impedance. The circuit further includes an output subcircuit coupled to an output of the first trans-impedance amplifier and coupled to an output of the second trans-impedance amplifier. The first trans-impedance amplifier and the second trans-impedance amplifier share a common output.

In general, another aspect of the subject matter described in this specification can be embodied in an integrated circuit that includes a first trans-impedance amplifier that includes: an input transistive element; and a first transistive element coupled in cascode to the input transistive element; and a second trans-impedance amplifier that includes: the input transistive element; and a second transistive element coupled in cascode to the input transistive element. Other embodiments of this aspect include corresponding systems.

These and other embodiments can optionally include one or more of the following features. The first trans-impedance amplifier further includes one or more first switches that disable the first trans-impedance amplifier. The second trans-impedance amplifier further includes one or more second switches that disable the second trans-impedance amplifier. Control logic coupled to the first transistive element and the one or more first switches, and the second transistive element and the one or more second switches, disables at least one of the first trans-impedance amplifier or the second trans-impedance amplifier.

First circuit elements of the first trans-impedance amplifier are coupled using a layout, and second circuit elements of the second trans-impedance amplifier are coupled using the same layout. The first trans-impedance amplifier includes a first resistive element with a first impedance, and the second trans-impedance amplifier includes a second resistive element with a second impedance; the second impedance being distinct from the first impedance. The circuit further includes an output subcircuit coupled to an output of the first trans-impedance amplifier and coupled to an output of the second trans-impedance amplifier. The first trans-impedance amplifier and the second trans-impedance amplifier share a common output.

In general, another aspect of the subject matter described in this specification can be embodied in an integrated circuit that includes a first trans-impedance amplifier that converts a current signal into a first voltage signal, the first voltage signal being produced at an output; and a second trans-impedance amplifier that converts the current signal into a second voltage signal, the second voltage signal being produced at the same output. The first trans-impedance amplifier includes one or more first switches that disable the first trans-impedance amplifier, the second trans-impedance amplifier includes one or more second switches that disable the second trans-impedance amplifier, and control logic coupled to the one or more first switches and the one or more second switches that disables at least one of the first trans-impedance amplifier or the second trans-impedance amplifier. Other embodiments of this aspect include corresponding systems.

These and other embodiments can optionally include one or more of the following features. First circuit elements of the first trans-impedance amplifier are coupled using a layout; and second circuit elements of the second trans-impedance amplifier are coupled using the same layout. The first trans-impedance amplifier includes a first resistive element with a first impedance, and the second trans-impedance amplifier includes a second resistive element with a second impedance; the second impedance being distinct from the first impedance.

In general, another aspect of the subject matter described in this specification can be embodied in a system that includes a current source that provides a current signal; and an integrated circuit that converts the current signal into a voltage signal. The integrated circuit includes: a first trans-impedance amplifier that includes a first cascode amplifier; and a second trans-impedance amplifier that includes a second cascode amplifier, the second cascode amplifier and the first cascode amplifier sharing an input transistive element. The first cascode amplifier is coupled to one or more first switches that disable the first trans-impedance amplifier, the second cascode amplifier is coupled to one or more second switches that disable the second trans-impedance amplifier, and control logic coupled to the one or more first switches and the one or more second switches disables at least one of the first trans-impedance amplifier or the second trans-impedance amplifier. Other embodiments of this aspect include corresponding integrated circuits.

In general, another aspect of the subject matter described in this specification can be embodied in an integrated circuit. The integrated circuit includes a first trans-impedance amplifier that converts a current signal into a first voltage signal, the first trans-impedance amplifier including: an input transistive element that receives the current signal; a first transistive element coupled in cascode to the input transistive element; a first resistive element having a first end and a second end, the first end of the first resistive element being coupled to the collector of the first transistive element; a second transistive element, where the drain of the second transistive element is coupled to the collector of the first transistive element, and the source of the second transistive element is coupled to ground; and a third transistive element, where the drain of the third transistive element is coupled to the second end of the first resistive element. The first trans-impedance amplifier is enabled when the first transistive element and the third transistive element are enabled, and the second transistive element is disabled.

The integrated circuit further includes a second trans-impedance amplifier that converts the current signal into a second voltage signal, the second trans-impedance amplifier including: the input transistive element; a fourth transistive element coupled in cascode to the input transistive element; a second resistive element having a first end and a second end, the first end of the second resistive element being coupled to the collector of the fourth transistive element; a fifth transistive element, where the drain of the fifth transistive element is coupled to the collector of the fourth transistive element, and the source of the fifth transistive element is coupled to ground; and a sixth transistive element, where the drain of the sixth transistive element is coupled to the second end of the second resistive element. The second trans-impedance amplifier is enabled when the fourth transistive element and the sixth transistive element are enabled, and the fifth transistive element is disabled.

Other embodiments of this aspect include corresponding systems.

These and other embodiments can optionally include one or more of the following features. The first resistive element has a first impedance, and the second resistive element has a second impedance; the second impedance being distinct from the first impedance. The circuit further includes an output subcircuit coupled to an output of the first trans-impedance amplifier and coupled to an output of the second trans-impedance amplifier. The first trans-impedance amplifier and the second trans-impedance amplifier share a common output.

In general, another aspect of the subject matter described in this specification can be embodied in a trans-impedance amplifier that includes a first cascode amplifier; a second cascode amplifier; one or more first switches disposed external to a signal path of the second cascode amplifier, where the one or more first switches are coupled to the first cascode amplifier to disable the first cascode amplifier; one or more second switches disposed external to a signal path of the first cascode amplifier, where the one or more second switches are coupled to the second cascode amplifier to disable the second cascode amplifier; and control logic coupled to the one or more first switches and the one or more second switches that disables at least one of the first cascode amplifier or the second cascode amplifier. Other embodiments of this aspect include corresponding integrated circuits and systems.

These and other embodiments can optionally include one or more of the following features. The first cascode amplifier includes: an input transistive element; and a first transistive element coupled in cascode to the input transistive element; and the second cascode amplifier includes: the input transistive element; and a second transistive element coupled in cascode to the input transistive element.

In general, another aspect of the subject matter described in this specification can be embodied in an integrated circuit that includes a first trans-impedance amplifier that includes an input transistive element; a second trans-impedance amplifier that shares the input transistive element; one or more first switches, disposed external to a signal path of the second trans-impedance amplifier, to disable the first trans-impedance amplifier, where the first trans-impedance amplifier includes the one or more first switches; one or more second switches, disposed external to a signal path of the first trans-impedance amplifier, to disable the second trans-impedance amplifier, where the second trans-impedance amplifier includes the one or more second switches; and control logic coupled to the one or more first switches and the one or more second switches that disables at least one of the first trans-impedance amplifier or the second trans-impedance amplifier. Other embodiments of this aspect include corresponding systems.

These and other embodiments can optionally include one or more of the following features. The circuit further includes a third trans-impedance amplifier that shares the input transistive element; and one or more third switches, disposed external to the signal paths of the first trans-impedance amplifier and second trans-impedance amplifier, to disable the third trans-impedance amplifier, where the third trans-impedance amplifier includes the one or more third switches. The control logic is further coupled to the one or more third switches to disable at least one of the first trans-impedance amplifier, second trans-impedance amplifier, or third trans-impedance amplifier.

Possible advantages of implementations of the invention can include the following. An integrated circuit that includes two or more trans-impedance amplifiers can provide increased flexibility with respect to modifications of the integrated circuit (e.g., for design specifications, and optimization). For example, impedances of a trans-impedance amplifier can be separately changed while reducing and/or eliminating effects of the change on other trans-impedance amplifiers in the integrated circuit. As another example, transistor sizes of a trans-impedance amplifier can also be separately changed while reducing and/or eliminating effects of the change on other trans-impedance amplifiers in the integrated circuit.

In addition, disposing switches external to signal paths of the trans-impedance amplifiers in an integrated circuit (e.g., a multi-rate trans-impedance amplifier) can reduce parasitic impedances and parasitic capacitances within an enabled trans-impedance amplifier, thereby improving the performance of the integrated circuit. Reducing parasitic impedances can result in increasing an accuracy and precision of impedances within the enabled trans-impedance amplifier (e.g., over variations of process, voltage, and temperatures), thereby increasing the accuracy and precision of the enabled trans-impedance amplifier. These advantages can be further enhanced if cascode coupling or a cascode amplifier is used in the trans-impedance amplifiers. Reducing parasitic capacitances on an input and/or output of the enabled trans-impedance amplifier can improve the operation of the enabled trans-impedance amplifier, in particular, at high speeds (e.g., reduce parasitic oscillations, increase bandwidth).

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Current-to-voltage converters can convert an input current signal into an output voltage signal. In applications that require increased sensitivity and bandwidth, trans-impedance amplifiers can be used to convert the input current signal into the output voltage signal. For example, trans-impedance amplifiers can be used in optical detection systems (e.g., photodetection systems) to detect low levels of light.

Figure 1A:
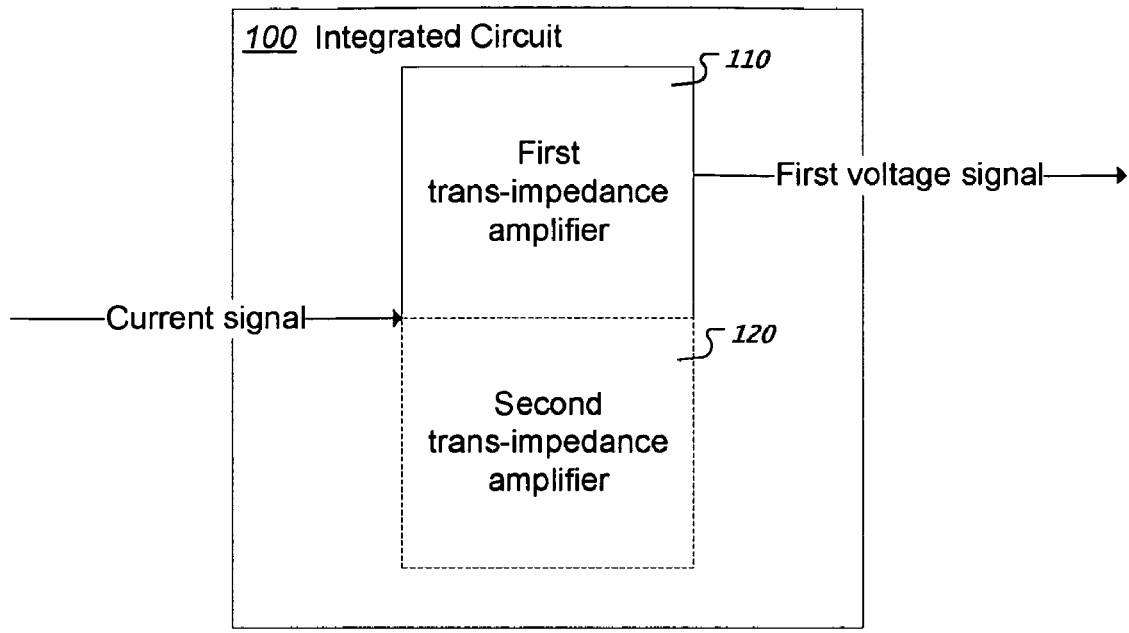
FIGS. 1A and 1B are block diagrams of an example trans-impedance amplifier operating at a first rate and a second rate, respectively.
Figure 1B:
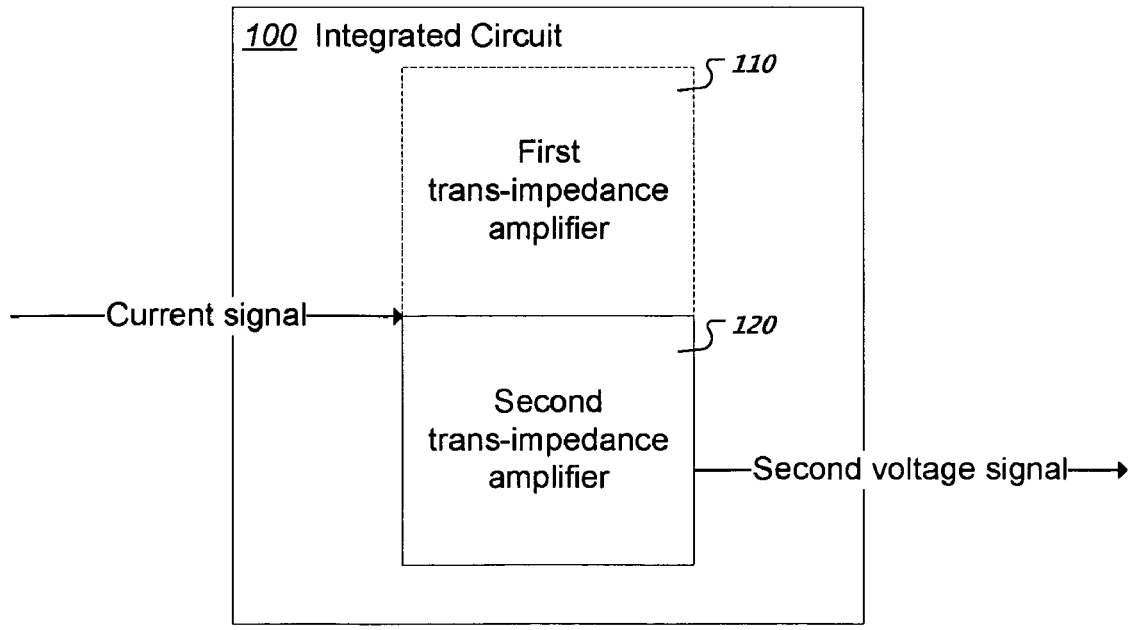

FIGS. 1A and 1B are block diagrams of an example trans-impedance amplifier operating at a first rate and a second rate, respectively.

As shown in FIG. 1A, an integrated circuit 100 (e.g., a multi-rate trans-impedance amplifier) can include a first trans-impedance amplifier 110 and a second trans-impedance amplifier 120. When enabled (as represented by a solid line), the first trans-impedance amplifier 110 can convert a current signal received at an input terminal of the integrated circuit 100 into a first voltage signal produced at a first output terminal of the integrated circuit 100. When the first trans-impedance amplifier 110 is enabled, the second trans-impedance amplifier 120 can be disabled (as represented by a dotted line). A disabled trans-impedance amplifier does not generate a voltage signal at the output terminal.

As shown in FIG. 1B, when enabled (as represented by a solid line), the second trans-impedance amplifier 120 can convert the current signal into a second voltage signal. The second voltage signal can be produced at a second output terminal of the integrated circuit 100. In some implementations, the integrated circuit 100 can have a single (e.g., common) output terminal. For example, an output terminal of the first trans-impedance amplifier 110 can be coupled to an output subcircuit and an output terminal of the second trans-impedance amplifier 120 can be coupled to the output subcircuit. A single output terminal of the output subcircuit can be a common output terminal of the integrated circuit 100.

The first trans-impedance amplifier 110 and the second trans-impedance amplifier 120 can be configured for different applications. In these and other implementations, the integrated circuit 100 can be a multi-rate trans-impedance amplifier, where the first trans-impedance amplifier 110 can produce the first voltage signal at a first rate (e.g., 10 Gb/sec) and the second trans-impedance amplifier can produce the second voltage signal at a second rate (e.g., 1 Gb/sec). Other implementations are possible. For example, the first trans-impedance amplifier 110 and the second trans-impedance amplifier 120 can each be configured for other specifications such as different gains (e.g., current to voltage amplifications); different bandwidths; different precisions (e.g., increased linearity or stability for fine/low speed operation; decreased linearity or stability for coarse/high speed operation); and different noise sensitivities.

Different combinations of these and other configurations of trans-impedance amplifiers can be included in the integrated circuit 100 for switching between different applications that require different specifications. In some implementations, the integrated circuit 100 can include more than two trans-impedance amplifiers. Each of the trans-impedance amplifiers can convert a current signal into a corresponding voltage signal.

Figure 2A:
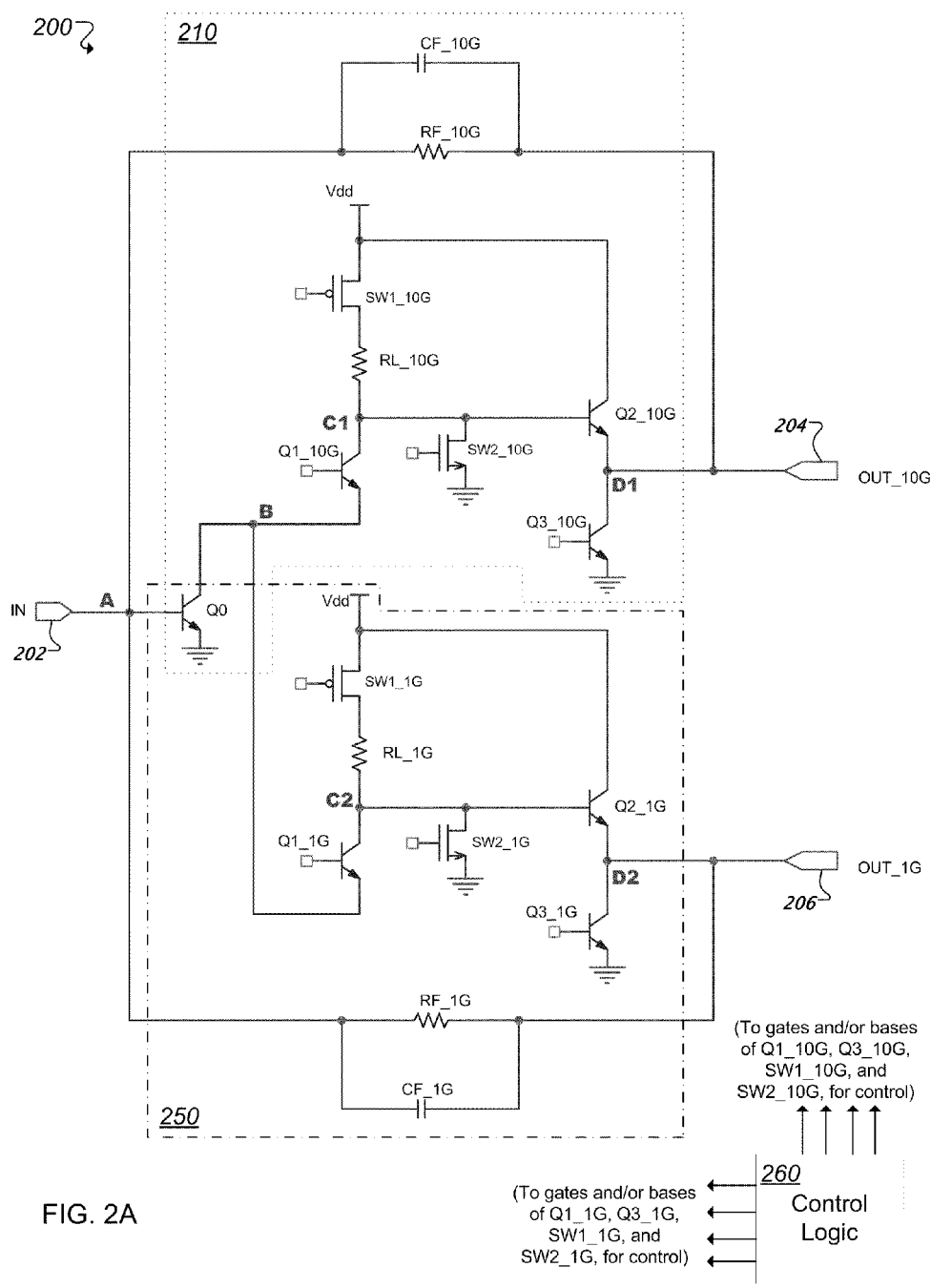
FIG. 2A is a schematic circuit diagram of an example trans-impedance amplifier.

FIG. 2A is a schematic circuit diagram of an example integrated circuit 200. In this example implementation, the integrated circuit 200 is a multi-rate trans-impedance amplifier that includes a first trans-impedance amplifier 210 and a second trans-impedance amplifier 250. The first trans-impedance amplifier 210 can be configured to operate at 10 Gb/sec, as represented by "10G" suffixes associated with circuit elements of the first trans-impedance amplifier 210. The second trans-impedance amplifier 250 can be configured to operate at 1 Gb/sec, as represented by "1G" suffixes associated with circuit elements of the second trans-impedance amplifier 250. The integrated circuit 200 includes an input terminal 202, a first output terminal 204, and a second output terminal 206. In some implementations, the first output terminal 204 and the second output terminal 206 can be coupled to an output subcircuit.

The first trans-impedance amplifier 210 includes a first cascode amplifier. The first cascode amplifier includes an input transistive element Q0 (e.g., an npn bipolar junction transistor), a first transistive element Q1__10G (e.g., an npn bipolar junction transistor), and a first resistive element RL__10G. The base of Q1 is coupled to the input terminal 202, and the emitter of Q0 can be coupled to ground. Q1__10G is coupled in cascode to Q0 at node B. As shown in FIG. 2A, the emitter of Q1__10G is coupled to the collector of Q0.

The collector of Q1__10G is also coupled to the drain of a second transistive element SW2__10G (e.g., a CMOS switch). The source of SW2__10G is coupled to ground. The drain of SW2__10G, and thus also the collector of Q1__10G, is also coupled to a third transistive element Q2__10G (e.g., an npn bipolar junction transistor), particularly to the base of Q2__10G. The emitter of Q2__10G is further coupled to the collector of a fourth transistive element Q3__10G (e.g., an npn bipolar junction transistor), at node D1. Node D1 is coupled to the first output terminal 204. The emitter of Q3__10G can be coupled to ground. In some implementations, the emitter of Q3__10G can be coupled to a resistive element that is coupled to ground.

In addition, the collector of Q1__10G is coupled to a first end of RL__10G. A second end of RL__10G is coupled to a fifth transistive element SW1__10G (e.g., another CMOS switch). In particular, the second end of RL__10G is coupled to the drain of SW1__10G. The source of SW1__10G is also coupled to a power supply (e.g., Vdd≦3.3 V) and to the collector of Q2__10G.

The first trans-impedance amplifier 210 also includes a first feedback subcircuit. The first feedback subcircuit includes a feedback resistive element RF__10G. A first end of RF__10G is coupled to the first output terminal 204, e.g., at node D1. A second end of RF__10G is coupled to the input terminal 202 of the integrated circuit 200, e.g., at node A. In some implementations, RF__10G can be coupled in parallel to a capacitive element CF_10G. CF_10G can be used to compensate for capacitance of an input current source (e.g., a photodiode coupled to the input terminal 202) and reduce instability of the integrated circuit 200, for example, at high gain.

As an example, for applications for a bit error rate (BER) of approximately $10^{-12}$ and input sensitivity of approximately 20 uA, values of RF_10G can range from 0.2 KΩ to 1 KΩ; values of CF_10G can range from 0 F to 10 fF; and values of RL_10G can range from 150 Ω to 300 Ω.

The transistive elements, e.g., Q1_10G, Q3_10G, SW1_10G, and SW2_10G, can be used to enable and disable the first trans-impedance amplifier 210. Control logic 260 can be coupled to the gates and/or bases of the transistive elements and used to enable and disable Q1_10G, Q3_10G, SW1_10G, and SW2_10G, thereby enabling and disabling the first cascode amplifier. By enabling and disabling the first cascode amplifier, the first trans-impedance amplifier 210 can be enabled and disabled.

Enabling the first trans-impedance amplifier 210 can include enabling Q1_10G, enabling Q3_10G, enabling SW1_10G, and disabling SW2_10G.

Enabling SW1_10G (e.g., turning "on" or closing the PMOS switch) can include applying a low voltage (e.g., 0 V) to the gate of SW1_10G. Disabling SW1_10G can include applying a high voltage (e.g., Vdd) to the gate of SW1_10G. When SW1_10G is enabled, SW1_10G effectively provides power to the first trans-impedance amplifier 210. Ideally, SW1_10G should have as low an impedance (e.g., a low parasitic impedance) and as high a capacitance (e.g., for smoothing), as possible. Therefore, in some implementations, SW1_10G can be chosen to be as large a transistive element as possible, consistent with spatial constraints on the die.

Disabling SW2_10G can include applying a low voltage (e.g., 0 V) to the gate of SW2_10G. Enabling SW2_10G can include applying a high voltage (e.g., Vdd V) to the gate of SW2_10G. When SW2_10G is disabled (e.g., the NMOS switch is "off", or open), the ground is no longer electrically coupled to node C1. Ideally, SW2_10G should have as low a capacitance (e.g., a low parasitic capacitance) as possible. When SW1_10G is disabled, no current flows through SW2_10G. Therefore, an effect of a parasitic impedance of SW2_10G is reduced or eliminated, and in some implementations, SW2_10G can be chosen to be as small a transistive element as possible.

When SW1_10G is enabled and SW2_10G is disabled, current caused by the power supply flows through RL_10G, causing a voltage to be applied at node C1. Enabling Q1_10G can include applying a high voltage to the base of Q1_10G (e.g., 1.2 V). Alternatively, disabling Q1_10G can include applying a low voltage (e.g., 0 V) to the base of Q1_10G.

Furthermore, Q3_10G can be enabled by applying a high voltage to the base of Q3_10G and disabled by applying a low voltage to the base of Q3_10G. In some implementations, the high voltage can be provided by a biasing circuit (e.g., a current mirror) coupled to the base of Q3_10G. The high voltage and low voltage can be selected so that Q3_10G provides a proper current bias for Q2_10G.

Enabling Q1_10G, enabling SW1_10G, disabling SW2_10G, and enabling Q3_10G results in enabling the first trans-impedance amplifier 210. The enabled first trans-impedance amplifier 210 converts the input current signal received at node A to an output voltage signal at the first output terminal 204 at the first rate. Voltages are formed at node C1 and node D1. The voltage at node D1 represents the output voltage signal converted from the input current signal at the first rate.

Disabling the first trans-impedance amplifier 210 can include disabling Q1_10G, disabling SW1_10G, enabling SW2_10G, and disabling Q3_10G. Disabling Q1_10G, disabling SW1_10G, enabling SW2_10G, and disabling Q3_10G results in coupling the ground to node C1 and a high impedance (e.g., greater than 100 Ω) at node D1.

In some implementations, circuit elements of the second trans-impedance amplifier 250 can be configured using the same layout as circuit elements of the first trans-impedance amplifier 210.

The second trans-impedance amplifier 250 includes a second cascode amplifier. The second cascode amplifier includes the input transistive element Q0 (e.g., shares Q0 with the first cascode amplifier), a sixth transistive element Q1_1G (e.g., an npn bipolar junction transistor), and a second resistive element RL_1G. Note that RL_1G has an impedance that is distinct from the impedance of RL_10G that allows the second trans-impedance amplifier 250 to operate at the second rate. For similar reasons, RF_1G and CF_1G also have different impedance and capacitance values as RF_10G and CF_10G, respectively. Q1_1G is coupled in cascode to Q0 at node B. As shown in FIG. 2A, the emitter of Q1_1G is coupled to the collector of Q0.

The collector of Q1_1G is also coupled to the drain of a seventh transistive element SW2_1G (e.g., a CMOS switch). The source of SW2_1G is coupled to ground. The drain of SW2_1 G, and thus also the collector of Q1_1G, is also coupled to an eighth transistive element Q2_1G (e.g., an npn bipolar junction transistor), particularly to the base of Q2_1G. The emitter of Q2_1G is further coupled to the collector of a ninth transistive element Q3_1G (e.g., an npn bipolar junction transistor), at the second output terminal 206. The emitter of Q3_1G can be coupled to ground. In some implementations, the emitter of Q3_1G can be coupled to a resistive element that is coupled to ground.

In addition, the collector of Q1_1G is coupled to a first end of RL_1G. A second end of RL_1G is coupled to a tenth transistive element SW1_1G (e.g., another CMOS switch). In particular, the second end of RL_1G is coupled to the drain of SW1_1G. The source of SW1_1G is also coupled to a power supply (e.g., Vdd) and to the collector of Q2_1G.

The second trans-impedance amplifier 250 also includes a second feedback subcircuit. The second feedback subcircuit includes a feedback resistive element RF_1G. A first end of RF_1G is coupled to the second output terminal 206. A second end of RF_1G is coupled to the input terminal 202 of the integrated circuit 200, e.g., at node A. In some implementations, RF_1G can be coupled in parallel to a capacitive element CF_1G. CF_1G can be used to compensate for capacitance of the input current source and reduce instability of the integrated circuit 200, for example, at high gain.

As an example, for applications for a bit error rate (BER) of approximately $10^{-12}$ and input sensitivity of approximately 4 uA, values of RF_1G can range from 2 KΩ to 3 KΩ; values of CF_1G can range from 0 F to 10 fF; and values of RL_1G can range from 0.5 KΩ to 2 KΩ.

The transistive elements, e.g., Q1_1G, Q3_1G, SW1_1G, and SW2_1G, can be used to enable and disable the second trans-impedance amplifier 250. Control logic 260 can be coupled to the gates and/or bases of the transistive elements and used to enable and disable Q1_1G, Q3_1G, SW1_1G, and SW2_1G, thereby enabling and disabling the second cascode amplifier. By enabling and disabling the second cascode amplifier, the second trans-impedance amplifier 250 can be enabled and disabled.

Enabling the second trans-impedance amplifier 250 can include enabling Q1_1G, enabling Q3_1G, enabling SW1_1G, and disabling SW2_1G.

Enabling SW1_1G (e.g., turning "on" or closing the PMOS switch) can include applying a low voltage (e.g., 0 V) to the gate of SW1_1G. Disabling SW1_1G can include applying a high voltage (e.g., Vdd) to the gate of SW1_1G. When SW1_1G is enabled, SW1_1G effectively provides power to the second trans-impedance amplifier 250. Ideally, SW1_1G should have as low an impedance (e.g., a low parasitic impedance) and as high a capacitance (e.g., for smoothing), as possible. Therefore, in some implementations, SW1_1G can be chosen to be as large a transistive element as possible, consistent with spatial constraints on the die.

Disabling SW2_1G can include applying a low voltage (e.g., 0 V) to the gate of SW2_1G. Enabling SW2_1G can include applying a high voltage (e.g., Vdd) to the gate of SW2_1G. When SW2_1G is disabled (e.g., the NMOS switch is "off", or open), the ground is no longer electrically coupled to node C2. Ideally, SW2_1G should have as low a capacitance (e.g., a low parasitic capacitance) as possible. When SW1_1G is disabled, no current flows through SW2_1G. Therefore, an effect of a parasitic impedance of SW2_1G is reduced or eliminated, SW2_1G can be chosen to be as small a transistive element as possible.

When SW1_1G is enabled and SW2_1G is disabled, current caused by the power supply flows through RL_1G, causing a voltage to be applied at node C2 Enabling Q1_1G can include applying a high voltage to the base of Q1_1G (e.g., 1.2 V). Alternatively, disabling Q1_1G can include applying a low voltage (e.g., 0 V) to the base of Q1_1G.

Furthermore, Q3_1G can be enabled by applying a high voltage to the base of Q3_1G and disabled by applying a low voltage to the base of Q3_1G. In some implementations, the high voltage can be provided by a biasing circuit (e.g., a current mirror) coupled to the base of Q3_1G. The high voltage and low voltage can be selected so that Q3_1G provides a proper current bias for Q2_1G.

Enabling Q1_1G, enabling SW1_1G, disabling SW2_1G, and enabling Q3_1G results in enabling the second trans-impedance amplifier 250. The enabled second trans-impedance amplifier 250 converts the input current signal received at node A to an output voltage signal at the second output terminal 206 at the second rate. Voltages are formed at node C2 and node D2. The voltage at node D2 represents the output voltage signal converted from the input current signal at the second rate. Disabling the second trans-impedance amplifier 250 can include disabling Q1_1G, disabling SW1_1G, enabling SW2_1G, and disabling Q3_1G. Disabling Q_1G, disabling SW1_1G, enabling SW2_1G, and disabling Q3_1G results in coupling the ground to node C2 and a high impedance (e.g., greater than 100 Ω) at node D2.

Using the example conventions described previously, the control logic 260 can be used to enable the first trans-impedance amplifier 210 and disable the second trans-impedance amplifier 250. As a result, the integrated circuit 200 converts the input current signal into an output voltage signal at the first rate. Alternatively, the control logic 260 can be used to disable the first trans-impedance amplifier 210 and enable the second trans-impedance amplifier 250. As a result, the integrated circuit 200 converts the input current signal into an output voltage signal at the second rate.

As shown in FIG. 2A, the transistive elements used to enable and disable the first trans-impedance amplifier 210 and the second trans-impedance amplifier 250, allowing the integrated circuit 200 to switch between the first trans-impedance amplifier 210 and the second trans-impedance amplifier 250 (e.g., switch between the first rate and the second rate), are disposed internal to a corresponding trans-impedance amplifier that the transistive elements control. In other words, the transistive elements that are used to control (e.g., enable and disable) the first trans-impedance amplifier 210 are disposed external to a signal path of the second trans-impedance amplifier 250. In addition, the transistive elements that are used to control the second trans-impedance amplifier 250 are disposed external to a signal path of the first trans-impedance amplifier 210.

The switching between the first trans-impedance amplifier 210 and the second trans-impedance amplifier 250 effectively occurs at node B of the integrated circuit 200. When the first trans-impedance amplifier 210 is disabled (and Q1_10G is disabled), a signal caused by the input current signal at node A flows through node B to the second trans-impedance amplifier 250. When the second trans-impedance amplifier 250 is disabled (and Q1_1G is disabled), a signal caused by the input current signal at node A flows through node B to the first trans-impedance amplifier 210.

As described previously, transistive elements can have inherent (e.g., parasitic) impedances and capacitances. Because the transistive elements, that are used to disable at least one of the first trans-impedance amplifier 210 or the second trans-impedance amplifier 250, are disposed external to a signal path of the enabled subcircuit (e.g., the first trans-impedance amplifier 210) of the integrated circuit 200, an effect of the parasitic impedances and capacitances of the disabled subcircuit (e.g., the second trans-impedance amplifier 250) on the enabled subcircuit can be reduced or eliminated.

Figure 2B:
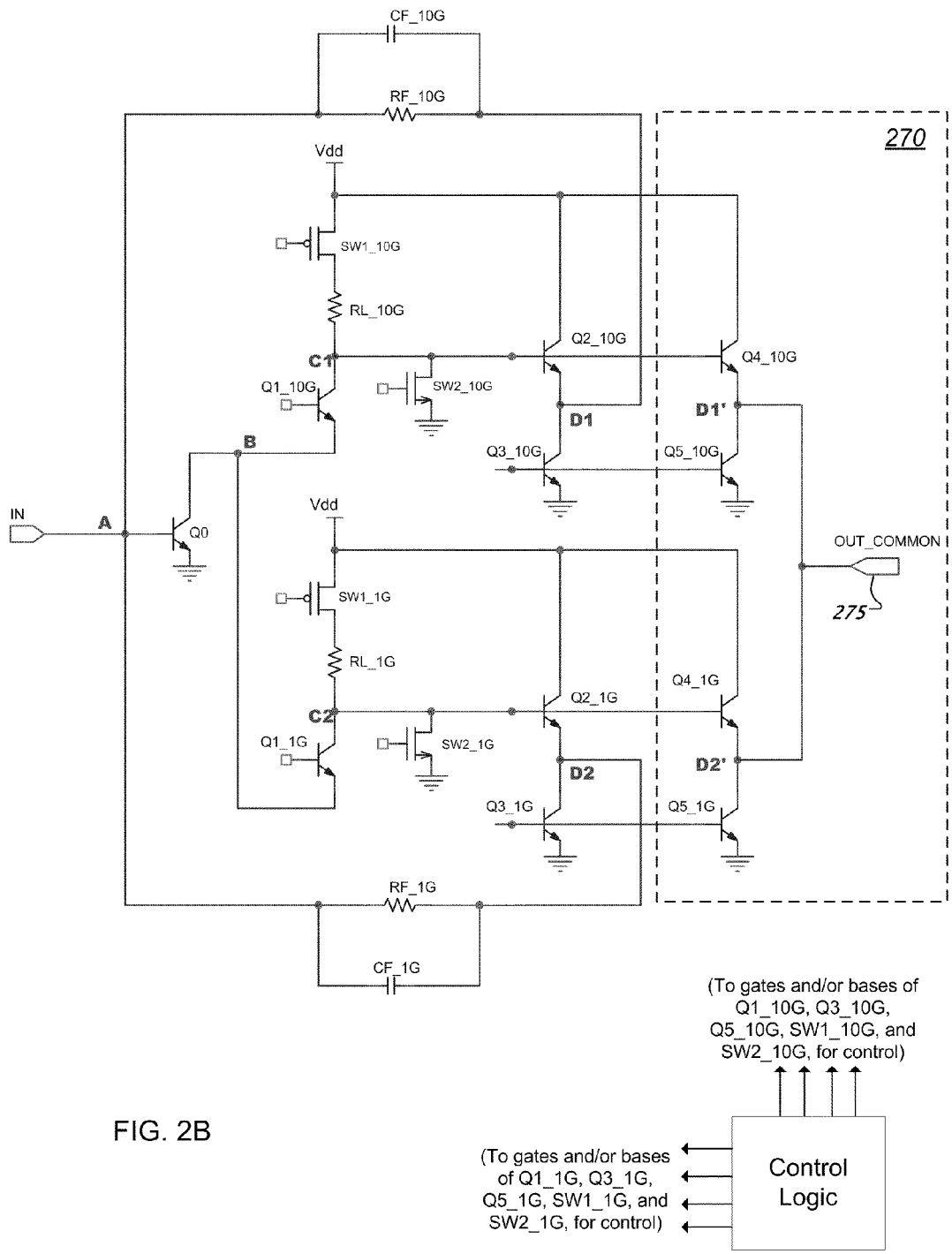
FIG. 2B is a schematic circuit diagram of the trans-impedance amplifier of FIG. 2A further coupled to an output subcircuit.

FIG. 2B is a schematic circuit diagram of the trans-impedance amplifier of FIG. 2A further coupled to an output subcircuit 270. The output subcircuit 270 includes a transistive element Q4_10G, a transistive element Q5_10G, a transistive element Q4_1G, and a transistive element Q5_1G.

Q4_10G and Q5_10G can be configured, as shown in FIG. 2B, and operate in a manner analogous to Q2_10G and Q3_10G, as described above. Similarly, Q4_1G and Q5_1G can be configured, as shown in FIG. 2B, and operate in a manner analogous to Q2_1G and Q3_1G, as described above. As a result, when the first trans-impedance amplifier 210 is enabled, a current signal can be converted to a first voltage signal produced at node D1'. Furthermore, when the second trans-impedance amplifier 250 is enabled, the current signal can be converted to a second voltage signal produced at node D2'. The nodes D1' and D2' can be coupled to a common output terminal 275. The common output terminal 275 can be the output terminal of the integrated circuit 200.

Figure 3:
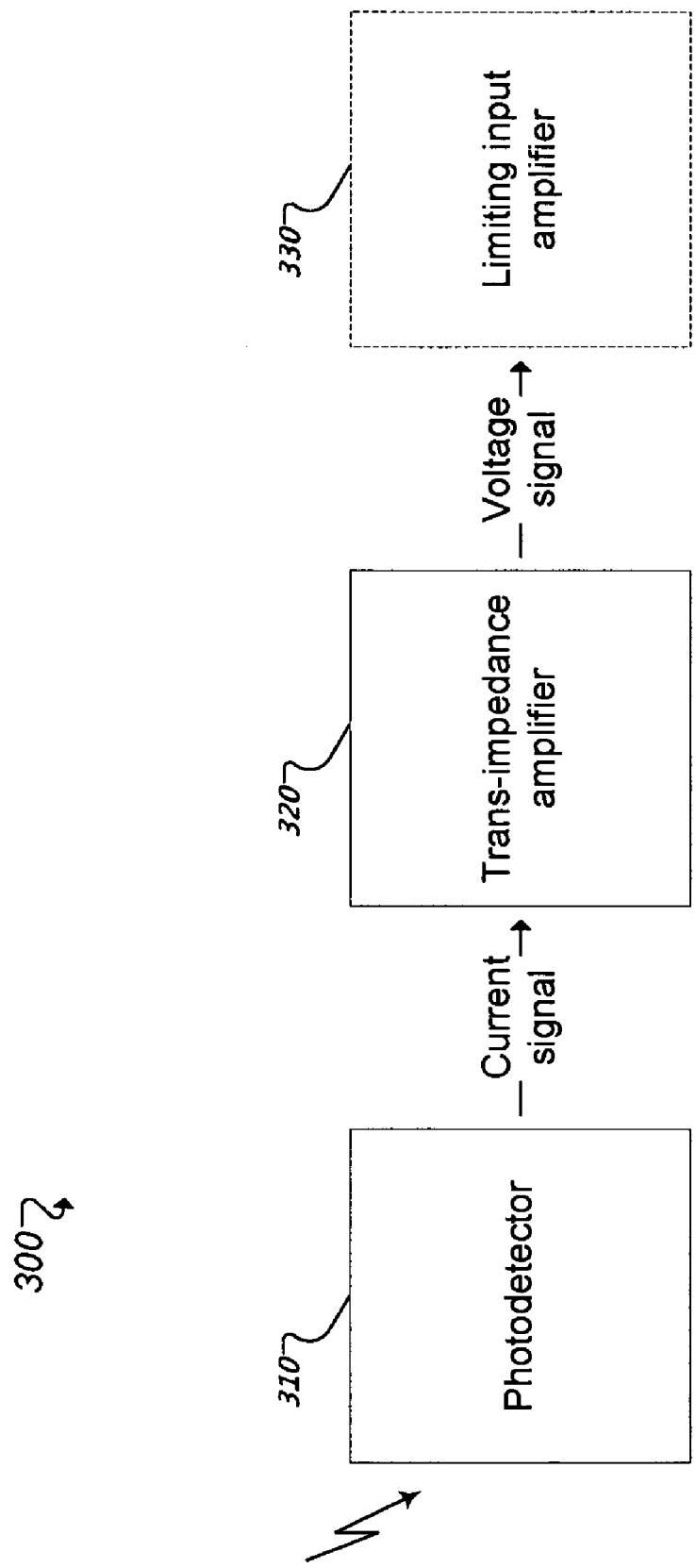
FIG. 3 is a block diagram of an example photodetection system.

FIG. 3 is a block diagram of an example photodetection system 300. The system 300 can be used in a variety of applications in optical communications systems, for example. The system 300 includes a photodetector 310, a trans-impedance amplifier 320 (e.g., integrated circuit 200), and a limiting input amplifier 330.

The photodetector 310 can be a photodiode, for example. The photodiode can receive photons of light and, in response, produce a current signal (e.g., a photocurrent). The trans-impedance amplifier 320 can receive the current signal, and convert the current signal into a voltage signal at one of a plurality of rates, for example. In some implementations, the trans-impedance amplifier 320 can be coupled to another stage to further process the output. The limiting input amplifier 330 can receive the voltage signal and attenuate the voltage signal to protect subsequent stages of the system 300 from input overdrive, for example.

The above described architecture and technologies can be used in a variety of electrical circuit applications. For example, the integrated circuit 200 can be used to sense values of bits stored in memory. In addition, disposing switches outside of a signal path can be advantageous for use in switching between multiple generators, converters, and loads, for example. Other applications are possible.

Possible advantages of implementations of the invention can also include the following (e.g., advantages enumerated (1) to (7)).

As described above, an integrated circuit can include two or more trans-impedance amplifiers (e.g., a first trans-impedance amplifier, a second trans-impedance amplifier) that share an input transistive element, and/or control logic that is coupled to one or more switches of each trans-impedance amplifier that disables at least one of the two trans-impedance amplifiers. Therefore, (1) an integrated circuit that includes two or more trans-impedance amplifiers can provide increased flexibility with respect to modifications of the integrated circuit (e.g., for design specifications, and optimization). For example, impedances of a trans-impedance amplifier can be separately changed while reducing and/or eliminating effects of the change on other trans-impedance amplifiers in the integrated circuit. As another example, transistor sizes of a trans-impedance amplifier can also be separately changed while reducing and/or eliminating effects of the change on other trans-impedance amplifiers in the integrated circuit.

Cascode coupling or a cascode amplifier can be used in the trans-impedance amplifiers. Therefore, (2) parasitic impedances and parasitic capacitances within an enabled trans-impedance amplifier can be reduced, thereby improving the performance of the integrated circuit. (3) Reducing parasitic impedances can result in increasing an accuracy and precision of impedances within the enabled trans-impedance amplifier (e.g., over variations of process, voltage, and temperatures), thereby increasing the accuracy and precision of the enabled trans-impedance amplifier. (4) Reducing parasitic capacitances between an input and output of the enabled trans-impedance amplifier can improve the operation of the enabled trans-impedance amplifier, in particular, at high speeds (e.g., reduce parasitic oscillations, increase bandwidth).

In addition, a first cascode amplifier of the first trans-impedance amplifier can include a first resistive element with a first impedance, and the second cascode amplifier of the second trans-impedance amplifier can include a second resistive element with a second impedance; the second impedance being distinct from the first impedance. (5) This implementation further illustrates its flexibility with respect to modifying the integrated circuit.

Furthermore, the integrated circuit can further include an output subcircuit coupled to an output of the first trans-impedance amplifier and coupled to an output of the second trans-impedance amplifier. Alternatively, the first trans-impedance amplifier and the second trans-impedance amplifier can share a common output. In these and other implementations, (6) each of the outputs of the trans-impedance amplifiers can be combined based on a desired application of the integrated circuit.

In addition, first circuit elements of the first trans-impedance amplifier can be coupled using a layout; and second circuit elements of the second trans-impedance amplifier can be coupled using the same layout. In these and other implementations, (7) an integrated circuit that includes trans-impedance amplifiers that use a same layout can further reduce parasitic capacitances, thereby improving the performance of the integrated circuit.

A number of implementations of the invention have been described. Nevertheless, it will be understood that various modifications may be made without departing from the spirit and scope of the invention. For example, the integrated circuit 200 can include two or more trans-impedance amplifiers (e.g., a first, second, and third trans-impedance amplifier). In the example, one or more switches may be disposed external to the signal paths of the first trans-impedance amplifier 210 and second trans-impedance amplifier 250, to disable the third trans-impedance amplifier, and the third trans-impedance amplifier can include one or more switches. In addition, the control logic 260 can be further coupled to the one or more switches of the third trans-impedance amplifier to disable at least one of the first trans-impedance amplifier 210, second trans-impedance amplifier 250, or third trans-impedance amplifier (not shown). Other implementations are within the scope of the following claims.

What is claimed is:

1. An integrated circuit comprising:
   a first trans-impedance amplifier that includes a first cascode amplifier; and
   a second trans-impedance amplifier that includes a second cascode amplifier, the second cascode amplifier and the first cascode amplifier sharing an input transistive element;
   where the first cascode amplifier is coupled to one or more first switches that disable the first trans-impedance amplifier, the second cascode amplifier is coupled to one or more second switches that disable the second trans-impedance amplifier, and control logic coupled to the one or more first switches and the one or more second switches disables at least one of the first trans-impedance amplifier or the second trans-impedance amplifiers;
   where the first cascode amplifier includes a first resistive element with a first impedance, and the second cascode amplifier includes a second resistive element with a second impedance; the second impedance being distinct from the first impedance.

2. The circuit of claim 1, further comprising:
   an output subcircuit coupled to an output of the first trans-impedance amplifier and coupled to an output of the second trans-impedance amplifier.

3. The circuit of claim 1, where the first trans-impedance amplifier and the second trans-impedance amplifier share a common output.

4. An integrated circuit comprising:
   a first trans-impedance amplifier that includes:
      an input transistive element; and
      a first transistive element coupled in cascode to the input transistive element; and
   a second trans-impedance amplifier that includes:
      the input transistive element; and
      a second transistive element coupled in cascode to the input transistive element;
   where the first trans-impedance amplifier includes a first resistive element with a first impedance, and the second trans-impedance amplifier includes a second resistive element with a second impedance; the second impedance being distinct from the first impedance.

5. The circuit of claim 4, where:
   the first trans-impedance amplifier further includes one or more first switches that disable the first trans-impedance amplifier; and the second trans-impedance amplifier further includes one or more second switches that disable the second trans-impedance amplifier;

where control logic coupled to the first transistive element and the one or more first switches, and the second transistive element and the one or more second switches, disables at least one of the first trans-impedance amplifier or the second trans-impedance amplifier.

6. The circuit of claim 4, where:
first circuit elements of the first trans-impedance amplifier are coupled using a layout; and
second circuit elements of the second trans-impedance amplifier are coupled using the same layout.

7. The circuit of claim 4, further comprising:
an output subcircuit coupled to an output of the first trans-impedance amplifier and coupled to an output of the second trans-impedance amplifier.

8. The circuit of claim 4, where the first trans-impedance amplifier and the second trans-impedance amplifier share a common output.

9. An integrated circuit comprising:
a first trans-impedance amplifier that converts a current signal into a first voltage signal, the first voltage signal being produced at an output; and
a second trans-impedance amplifier that converts the current signal into a second voltage signal, the second voltage signal being produced at the same output;
where the first trans-impedance amplifier includes one or more first switches that disable the first trans-impedance amplifier, the second trans-impedance amplifier includes one or more second switches that disable the second trans-impedance amplifier, and control logic coupled to the one or more first switches and the one or more second switches that disables at least one of the first trans-impedance amplifier or the second trans-impedance amplifier;
where the first trans-impedance amplifier includes a first resistive element with a first impedance, and the second trans-impedance amplifier includes a second resistive element with a second impedance; the second impedance being distinct from the first impedance.

10. The circuit of claim 9, where:
first circuit elements of the first trans-impedance amplifier are coupled using a layout; and
second circuit elements of the second trans-impedance amplifier are coupled using the same layout.

11. A system comprising:
a current source that provides a current signal; and
an integrated circuit that converts the current signal into a voltage signal, the integrated circuit including:
a first trans-impedance amplifier that includes a first cascode amplifier; and
a second trans-impedance amplifier that includes a second cascode amplifier, the second cascode amplifier and the first cascode amplifier sharing an input transistive element;
where the first cascode amplifier is coupled to one or more first switches that disable the first trans-impedance amplifier, the second cascode amplifier is coupled to one or more second switches that disable the second trans-impedance amplifier, and control logic coupled to the one or more first switches and the one or more second switches disables at least one of the first trans-impedance amplifier or the second trans-impedance amplifier;
where the first cascode amplifier includes a first resistive element with a first impedance, and the second cascode amplifier includes a second resistive element with a second impedance; the second impedance being distinct from the first impedance.

12. An integrated circuit comprising:
a first trans-impedance amplifier that converts a current signal into a first voltage signal, the first trans-impedance amplifier including:
an input transistive element that receives the current signal;
a first transistive element coupled in cascode to the input transistive element;
a first resistive element having a first end and a second end, the first end of the first resistive element being coupled to the collector of the first transistive element;
a second transistive element, where the drain of the second transistive element is coupled to the collector of the first transistive element, and the source of the second transistive element is coupled to ground; and
a third transistive element, where the drain of the third transistive element is coupled to the second end of the first resistive element;
where the first trans-impedance amplifier is enabled when the first transistive element and the third transistive element are enabled, and the second transistive element is disabled; and
a second trans-impedance amplifier that converts the current signal into a second voltage signal, the second trans-impedance amplifier including:
the input transistive element;
a fourth transistive element coupled in cascode to the input transistive element;
a second resistive element having a first end and a second end, the first end of the second resistive element being coupled to the collector of the fourth transistive element;
a fifth transistive element, where the drain of the fifth transistive element is coupled to the collector of the fourth transistive element, and the source of the fifth transistive element is coupled to ground; and
a sixth transistive element, where the drain of the sixth transistive element is coupled to the second end of the second resistive element;
where the second trans-impedance amplifier is enabled when the fourth transistive element and the sixth transistive element are enabled, and the fifth transistive element is disabled.

13. The circuit of claim 12, where:
the first resistive element has a first impedance, and the second resistive element has a second impedance; the second impedance being distinct from the first impedance.

14. The circuit of claim 12, further comprising:
an output subcircuit coupled to an output of the first trans-impedance amplifier and coupled to an output of the second trans-impedance amplifier.

15. The circuit of claim 12, where the first trans-impedance amplifier and the second trans-impedance amplifier share a common output.

16. A trans-impedance amplifier comprising:
a first cascode amplifier;
a second cascode amplifier;
one or more first switches disposed external to a signal path of the second cascode amplifier, where the one or more first switches are coupled to the first cascode amplifier to disable the first cascode amplifier;
one or more second switches disposed external to a signal path of the first cascode amplifier, where the one or more second switches are coupled to the second cascode amplifier to disable the second cascode amplifier; and control logic coupled to the one or more first switches and the one or more second switches that disables at least one of the first cascode amplifier or the second cascode amplifier;

where the first cascode amplifier includes a first resistive element with a first impedance, and the second cascode amplifier includes a second resistive element with a second impedance; the second impedance being distinct from the first impedance.

17. The trans-impedance amplifier of claim 16, where:
the first cascode amplifier includes:
   an input transistive element; and
   a first transistive element coupled in cascode to the input transistive element; and
the second cascode amplifier includes:
   the input transistive element; and
   a second transistive element coupled in cascode to the input transistive element.

18. An integrated circuit comprising:
a first trans-impedance amplifier that includes an input transistive element;
a second trans-impedance amplifier that shares the input transistive element;
one or more first switches, disposed external to a signal path of the second trans-impedance amplifier, to disable the first trans-impedance amplifier, where the first trans-impedance amplifier includes the one or more first switches;
one or more second switches, disposed external to a signal path of the first trans-impedance amplifier, to disable the second trans-impedance amplifier, where the second trans-impedance amplifier includes the one or more second switches; and
control logic coupled to the one or more first switches and the one or more second switches that disables at least one of the first trans-impedance amplifier or the second trans-impedance amplifier;
where the first trans-impedance amplifier includes a first resistive element with a first impedance, and the second trans-impedance amplifier includes a second resistive element with a second impedance; the second impedance being distinct from the first impedance.

19. The circuit of claim 18 further comprising:
a third trans-impedance amplifier that shares the input transistive element; and
one or more third switches, disposed external to the signal paths of the first trans-impedance amplifier and second trans-impedance amplifier, to disable the third trans-impedance amplifier, where the third trans-impedance amplifier includes the one or more third switches;
where the control logic is further coupled to the one or more third switches to disable at least one of the first trans-impedance amplifier, second trans-impedance amplifier, or third trans-impedance amplifier.

* * * * *